United States Patent

Calaway

[15] 3,691,474

[45] Sept. 12, 1972

[54] PHASE DETECTOR INITIALIZER FOR OSCILLATOR SYNCHRONIZATION

[72] Inventor: Ward M. Calaway, Sierra Madre, Calif.

[73] Assignee: Burroughs Corporation, Detroit, Mich.

[22] Filed: Dec. 4, 1970

[21] Appl. No.: 95,206

[52] U.S. Cl. ......................331/1 A, 328/133, 331/17, 331/25

[51] Int. Cl. ...............................................H03b 3/04

[58] Field of Search ............331/1 A, 18, 2, 5, 17, 27; 307/232; 328/133, 134

[56] References Cited

UNITED STATES PATENTS

| | | | |
|---|---|---|---|
| 3,337,814 | 8/1967 | Brase et al. | 331/18 |
| 3,351,868 | 11/1967 | Farrow | 331/27 |
| 3,588,734 | 6/1971 | Welti | 331/12 |
| 3,611,175 | 10/1971 | Boelke | 331/25 |

*Primary Examiner*—Roy Lake
*Assistant Examiner*—Siegfried H. Grimm
*Attorney*—Christie, Parker & Hale

[57] ABSTRACT

In a synchronization system having a phase detector, a voltage controlled oscillator, and a source of a reference signal, an initializer prevents the establishment of a regenerative mode. The output signal of the voltage controlled oscillator and the reference signal are applied to the inputs of the phase detector, which develops a control signal to adjust the period of the oscillator. The initializer couples the reference signal to the input of the phase detector either directly or inverted in phase, depending upon whether the reference signal leads the oscillator signal by less than 180° or lags the oscillator signal by less than 180°. As a result, the control signal does not change responsive to changes in the phase difference between the oscillator signal and the reference signal unless the synchronization system is operating in a degenerative mode.

13 Claims, 7 Drawing Figures

INVENTOR.
WARD M. CALAWAY

ATTORNEYS

CONTINUED IN FIG. 3

INVENTOR
WARD M. CALAWAY

INVENTOR
WARD M. CALAWAY

INVENTOR
WARD M. CALAWAY

PHASE DETECTOR INITIALIZER FOR OSCILLATOR SYNCHRONIZATION

CROSS REFERENCE TO RELATED APPLICATIONS

This application is related to my applications Ser. No. 95,077 and Ser. No. 95,079 filed concurrently on Dec. 4, 1970.

BACKGROUND OF THE INVENTION

This invention relates to oscillator synchronization and, more particularly, to a phase detector initializer for preventing an oscillator synchronization system from entering a regenerative mode.

Typically, in a synchronization system, the output signal of an oscillator having a controllable frequency and a periodic reference signal are applied to the inputs of a phase detector that develops a control signal proportional in amplitude to the phase difference between the applied signals. The control signal is coupled to the oscillator to adjust its frequency so as to bring the oscillator output signal into frequency or phase synchronization with the reference signal. Rapid synchronization is extremely important in data storage systems that employ a disc file memory because it affects the access time to the memory.

A conventional phase detector has a response with a slope in one direction for a phase difference between 0° and 180° and a slope in the opposite direction for a phase difference between 180° and 360°. In other words, the control signal developed by the phase detector increases responsive to increases in phase difference when one of the input signals leads the other input signal by less than 180° and decreases responsive to increases in the phase difference when the one signal lags the other signal by less than 180°. In the one case, the slope of the phase detector response permits the synchronization system to operate in a degenerative mode, i.e. negative feedback brings the oscillator frequency toward synchronization. In the other case, the slope of the phase detector response permits the synchronization system to operate in a regenerative mode, i.e. positive feedback draws the oscillator frequency away from synchronization. Thus, at the time the synchronization system is initially activated, if the wrong phase relationship exists between the input signals, the frequency of the oscillator is driven away from the frequency required to establish synchronization. This hunting process continues until the proper phase relationship between the input signals is finally established at which time the frequency of the oscillator is driven degeneratively toward synchronization. The transient disturbance to the synchronization system caused by this hunting process substantially lengthens the time to establish synchronization.

SUMMARY OF THE INVENTION

The invention involves an initializer that establishes the proper phase relationship between the input signals applied to a phase detector in a synchronization system. Specifically, the initializer couples one of the input signals to the phase detector either directly or inverted in phase by 180°, depending upon the phase relationship between the input signals. In either case, the initializer couples the one input signal to the phase detector so the one input signal is in its proper phase relationship relative to the other input signal.

In one embodiment, the source of reference signals is coupled directly to one input of a phase detector when a control switch is in one state and is coupled through a phase inverter to the input of the phase detector when the control switch is in the other state. The state of the switch is determined by a logic control circuit that monitors the phase difference between the reference signal and the output signal of a signal controlled oscillator, which is coupled to the other input of the phase detector. The output of the phase detector is coupled to the oscillator as a control signal to adjust its frequency to establish synchronization with the reference signal. In effect, the initializer prevents the control signal from changing in response to changes in the phase difference between the oscillator output signal and the reference signal when their phase relationship is wrong, i.e., when their phase relationship would permit the synchronization system to operate in a regenerative mode.

BRIEF DESCRIPTION OF THE DRAWINGS

The features of specific embodiments of the best mode contemplated of carrying out the invention are illustrated in the drawings, in which.

DETAILED DESCRIPTION OF THE DRAWINGS

Figure 5:
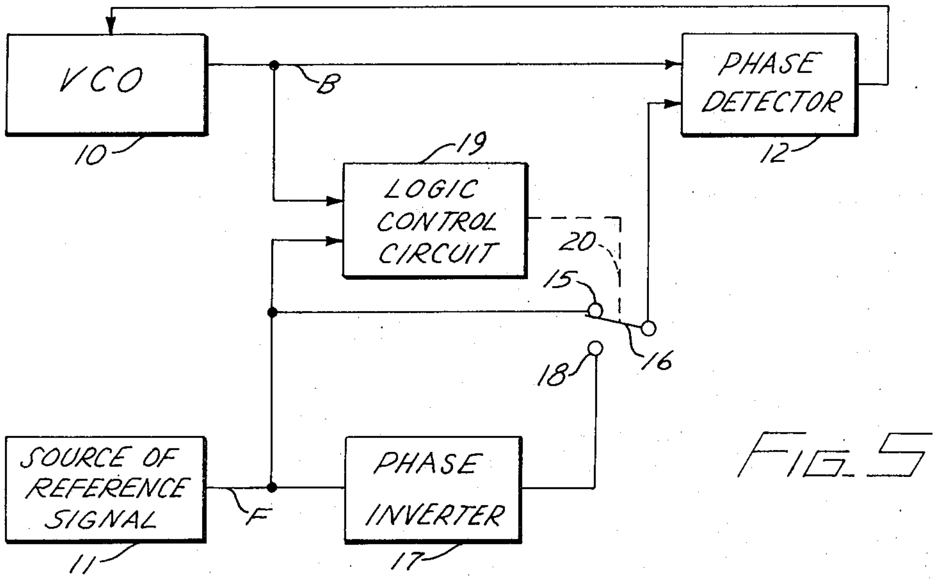
FIG. 5 is a block schematic diagram of a simplified version of a frequency synchronization system employing the principles of the invention.

In FIG. 5 there is shown a phase synchronization system including a voltage controlled oscillator 10, a source of a reference signal 11, and a phase detector 12. Voltage controlled oscillator 10 and source 11 are connected to the inputs of phase detector 12, which develops at its output a control signal proportional to the phase difference between the output signal of oscillator 10 and the reference signal of source 11. The control signal is coupled to oscillator 10 to adjust its frequency so as to establish synchronization with the frequency of the reference signal of source 11. For the purpose of discussion it is assumed that oscillator 10 and source 11 produce binary signals having a square waveform that oscillates between a positive potential and ground potential and the frequency of oscillator 10 is higher than the frequency of the reference signal. Further, it is assumed phase detector 12 comprises an AND gate actuated by a positive potential, a ramp generator, and a sample and hold circuit. The reference signal and the complement of the output signal of oscillator 10 are applied to the inputs of the AND gate. The ramp generator is actuated by a positive potential at the output of the AND gate to convert the pulses at the output of the AND gate to ramp signals having peaks proportional to the duration of the pulses at the output of the AND gate. The sample and hold circuit produces a control signal proportional to the peaks of the ramp signal.

Figure 6:
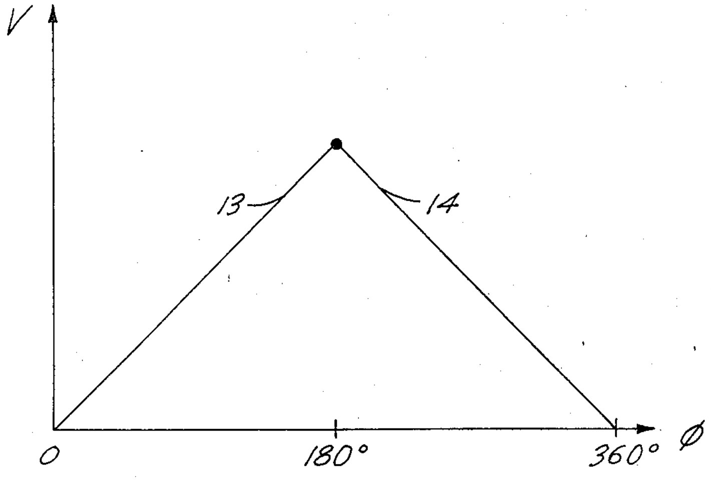
FIG. 6 is a diagram depicting the response of a typical phase detector.
Figure 7:
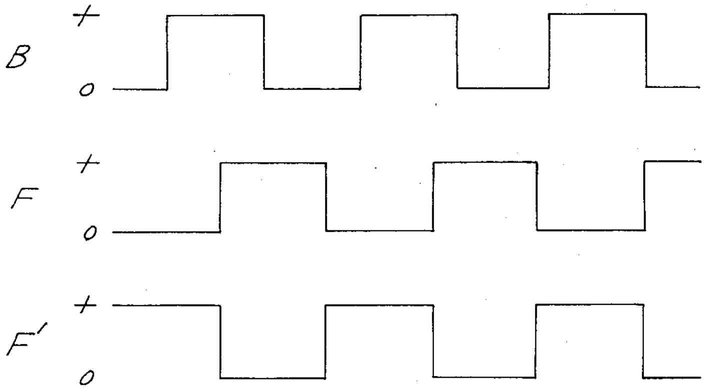
FIG. 7 is a diagram of several waveforms as a function of time that serve to illustrate the problem solved by the invention.

In FIG. 7, waveforms B and F represent the output signal of oscillator 10 and the reference signal respectively for the case in which the output signal of oscillator 10 leads the reference signal by less than 180°. In this case, phase detector 12 measures the time interval between the negative-going transitions of waveforms B and F, i.e., the coincidence between a positive potential in waveform F and ground potential in waveform B. When the phase lead of waveform B over waveform F increases, the control signal developed by phase detector 12 also increases. This condition is represented in the phase detector response curve of FIG. 6 by a segment 13 having a positive slope. In this response curve, the ordinate labeled V represents the amplitude of the control signal and the abscissa labeled $\phi$ represents the phase lead of the output signal of oscillator 10 relative to the reference signal.

Since the frequency of waveform B is higher than that of waveform F, the interval between the negative-going transitions increases and the control signal developed by phase detector 12 increases from cycle to cycle. To bring about frequency synchronization, the control signal is applied to oscillator 10 in a sense to decrease its frequency. In other words, an increase in the control signal provides a decrease in the frequency of oscillator 10. Therefore, the synchronization system operates in a degenerative mode when the phase detector response has a positive slope, i.e., is operating along segment 13.

Waveforms B and F′ represent the case in which the output signal from oscillator 10 lags the reference signal by less than 180°, i.e. the case in which the output signal from oscillator 10 leads the reference signal by more than 180°. In this case, phase detector 12 measures the time interval between the positive-going transitions of waveforms B and F′. When the phase lead of waveform B over waveform F′ increases, i.e. the phase lag of waveform B over waveform F′ decreases, the control signal developed by phase detector 12 decreases. This condition is represented in the phase detector response curve of FIG. 6 by a segment 14 having a negative slope. Since the frequency of waveform B is higher than that of waveform F′, the interval between the positive-going transitions decreases and the control signal developed by phase detector 12 decreases from cycle to cycle. This decrease causes the frequency of oscillator 10 to increase, whereas a decrease in frequency is required to establish synchronization. In other words, the synchronization system operates in a regenerative mode instead of a degenerative mode, when the phase detector response has a negative slope, i.e., is operating along segment 14.

To prevent the synchronization system from entering a regenerative mode, the reference signal from source 11 is coupled to the input of phase detector 12 through two alternative paths. One path is a direct connection through a contact 15 of a control switch 16. The other path is a connection through a phase inverter 17 and a contact 18 of control switch 16. Phase inverter 17 shifts the phase of the reference signal by 180°. The outputs of oscillator 10 and source 11 are connected to a logic control circuit 19, which operates control switch 16 as depicted by a dashed line 20. Switch 16 could be an electronic switch or a mechanical switch depending upon the frequency of operation of oscillator 10. Logic control circuit 19 monitors the phase relationship between the output signal of oscillator 10 and the reference signal. When this phase relationship is proper, i.e. when the output signal of oscillator 10 leads the reference signal by less than 180°, logic control circuit 19 closes contact 15 of switch 16 so the reference signal is directly connected to the input of phase detector 12. When the phase relationship is improper, i.e. when the output signal of oscillator 10 lags the reference signal by less than 180°, logic control circuit 19 closes contract 18 of switch 16 so the reference signal is applied to the input of phase detector 12 inverted in phase by 180°. This phase inversion causes the applied input signals to phase detector 12 to have the proper phase relationship. In other words, when the reference signal is inverted in phase by 180°, the output signal of oscillator 10 leads the inverted reference signal by less than 180°. In summary, logic control circuit 19 controls switch 16 so as to supply the reference signal of source 11 to phase detector 12 in the proper phase relationship relative to the output signal of oscillator 10 to maintain the synchronization system in a degenerative mode.

Figure 1:
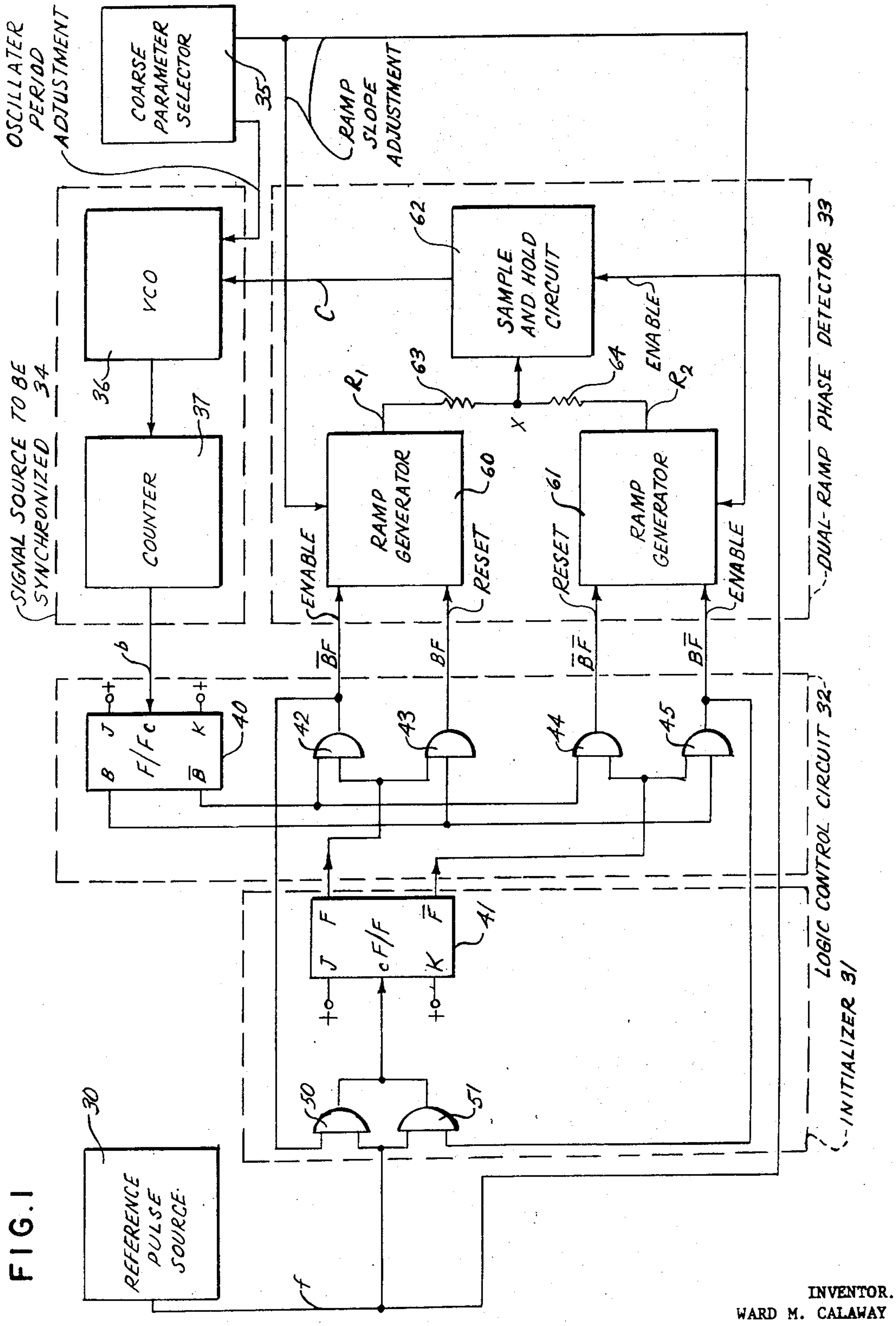
FIG. 1 is a block schematic diagram of a frequency synchronization system incorporating the principles of the invention.

In FIG. 1 there is shown a synchronization system comprising a reference pulse source 30, an initializer 31, a logic control circuit 32, a dual-ramp phase detector 33, a signal source 34 to be synchronized, and a coarse parameter selector 35. Source 30 corresponds to source 11 in FIG. 5; initializer 31 corresponds to switch 16 and phase inverter 17 in FIG. 5; logic control circuit 32 corresponds to logic control circuit 19 in FIG. 5; dual ramp phase detector 33 corresponds to phase detector 12 in FIG. 5; and source 34 corresponds to oscillator 10 in FIG. 5.

Figure 2:
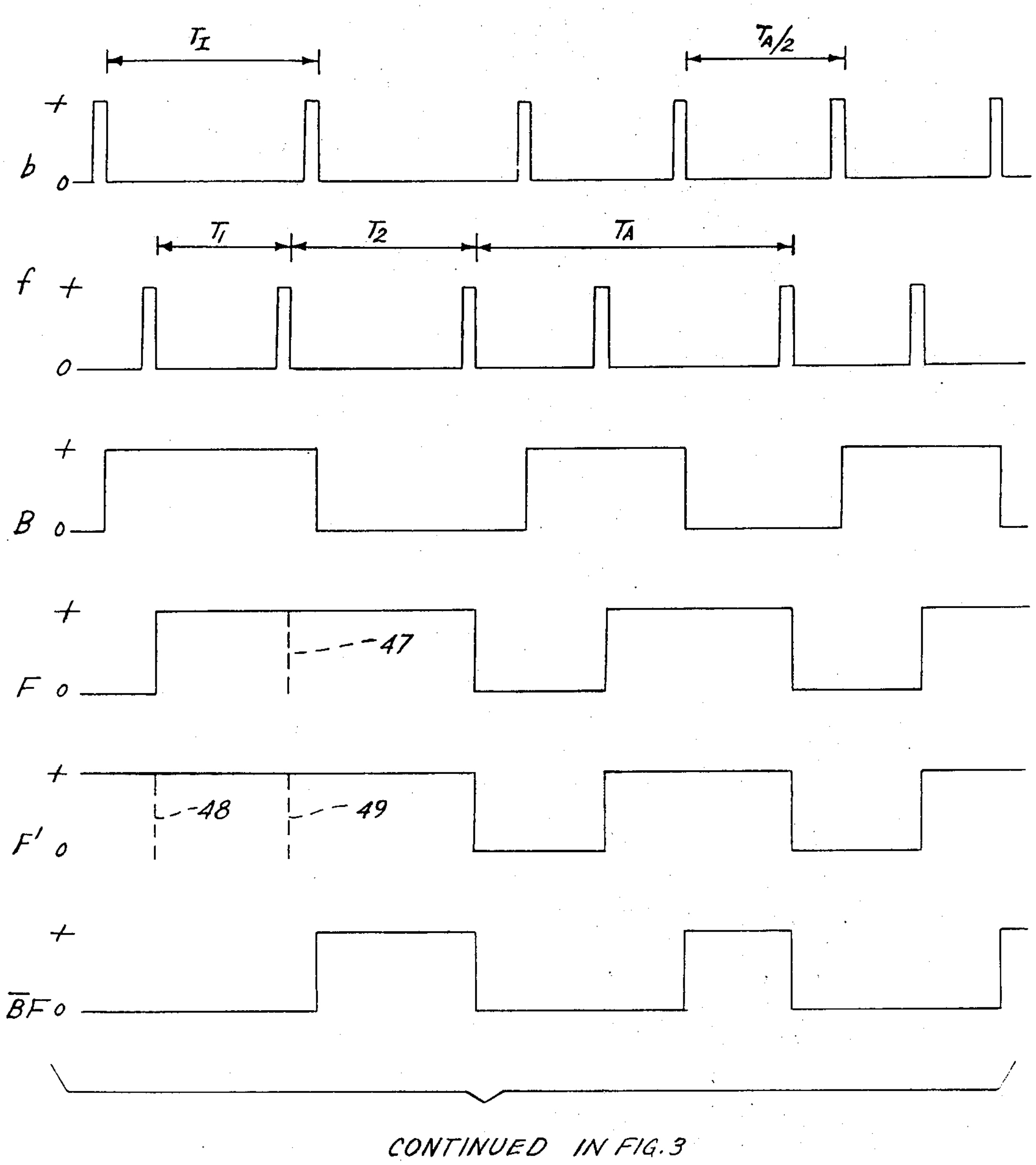
FIGS. 2 and 3 are diagrams of the waveforms appearing at various points of the schematic diagram of FIG. 1 as a function of time.

Signal source 34 comprises a voltage controlled oscillator 36 and a counter 37 connected to the output of oscillator 36. Counter 37 serves as a frequency divider for the pulses produced by oscillator 36 so one pulse appears at the output of counter 37 for every larger number of pulses appearing at the output of oscillator 36. In other words, counter 37 scales down the number of pulses produced by oscillator 36. It is assumed the scaling factor $k$ of counter 37 is 10. The pulses appearing at the output of counter 37 are represented in FIG. 2 by waveform *b*. Counter 37 is not essential to the broader aspects of the invention; its purpose is to facilitate the recovery of data from a disc file memory system, as explained in more detail below in connection with FIG. 4. Source 30 corresponds to source 11 in FIG. 5; initializer 31 corresponds to switch 16 and phase inverter 17 in FIG. 5; logic control circuit 32 corresponds to logic control circuit 19 in FIG. 5; dual ramp phase detector 33 corresponds to phase detector 12 in FIG. 5; and source 34 corresponds to oscillator 10 in FIG. 5.

Figure 3:
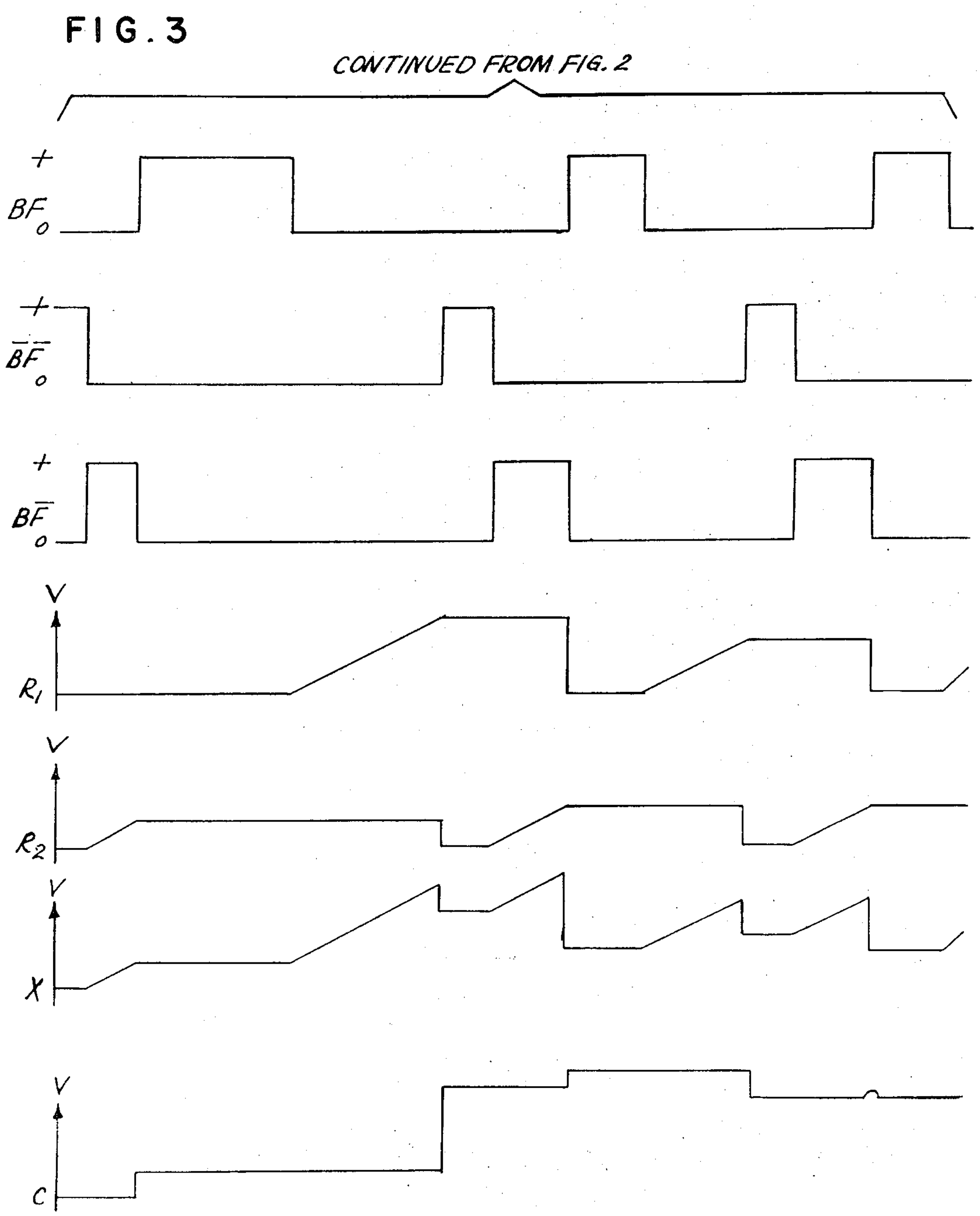

Logic control circuit 32 comprises a J-K flip-flop 40, an AND gate 42, an AND gate 43, an AND gate 44, and an AND gate 45. Initializer 31 comprises a J-K flip-flop 41, an AND gate 50, and an AND gate 51. Flip-flops 40 and 41 are bistable devices having J, C, and K inputs and B and $\bar{B}$ outputs, in the case of flip-flop 40, and F and $\bar{F}$ outputs in the case of flip-flop 41. For the purpose of illustrating the operation of the invention, it is assumed that flip-flops 40 and 41, AND gates 42 through 45, 50, and 51 and all other binary circuits and signals in FIG. 1 are either at a positive potential or at ground potential. The J and K inputs of flip-flops 40 and 41 are both connected to a source of positive potential. Accordingly, when the C input of these flip-flops experiences a transition from positive to ground potential, which occurs at the end of each pulse applied thereto, the flip-flop changes state, e.g. the B output changes from a positive potential to ground potential and the $\bar{B}$ output changes from ground to positive potential, or vice versa. Thus, as connected, flip-flops 40 and 41 serve to divide by two the frequency of the pulses applied to their C inputs and to convert the waveform to a square wave. The output of counter 37 is connected to the C input of flip-flop 40. The $\bar{B}$ output of flip-flop 40 is connected to one input of AND gate 42 and to one input of AND gate 44, while the B output of flip-flop 40 is connected to one input of AND gate 43 and to one input of AND gate 45. The F output of flip-flop 41 is connected to the other input of AND gate 42 and to the other input of AND gate 43, while the $\bar{F}$ output of flip-flop 41 is connected to the other input of AND gate 44 and to the other input of AND gate 45. The binary signals appearing at the B output of flip-flop 40, the F output of flip-flop 41, the output of AND gate 42, the output of AND gate 43, the output of AND gate 44, and the output of AND gate 45 are represented in FIGS. 2 and 3 respectively by waveforms B, F, $\bar{B}F$, BF, $\bar{B}\bar{F}$, and $B\bar{F}$. As depicted by the waveforms in FIGS. 2 and 3, the output of AND gate 42 is at a positive potential only when the $\bar{B}$ output of flip-flop 40 and the F output of flip-flop 41 are at a positive potential; the output of AND gate 43 is at a positive potential only when the B output of flip-flop 40 and the F output of flip-flop 41 are at a positive potential; the output of AND gate 44 is at a positive potential only when the $\bar{B}$ output of flip-flop 40 and the $\bar{F}$ output of flip-flop 41 are at a positive potential; and the output of AND gate 45 is at a positive potential only when the B output of flip-flop 40 and the $\bar{F}$ output of flip-flop 41 are at a positive potential.

Reference pulse source 30 produces asymmetrical periodic pulses represented by waveform *f* in FIG. 2. This asymmetry is typical of the clock pulses recovered from the clock track of a disc file memory system. As depicted, the time interval $T_1$ between one pair of successive pulses is different from the time interval $T_2$ between the following pair of successive pulses, although the sum of $T_1$ and $T_2$, i.e., $T_A$, is substantially constant. It is in this sense that the reference pulses produced by source 30 are asymmetrical. $T_A$ is the average period of the reference pulses from source 30, i.e., $T_1+T_2$.

Initializer 31 functionally shares AND gates 42 and 45 with logic control circuit 32. The output of source 30 is connected to one input of AND gate 50 and one input of AND gate 51. The output of AND gate 42 is connected to the other input of AND gate 50 and the output of AND gate 45 is connected to the other input of AND gate 51. The outputs of AND gates 50 and 51 are both coupled to the C input of flip-flop 41 so flip-flop 41 changes state each time the output of AND gate 50 or the output of AND gate 51 undergoes a transition from positive to ground potential. As discussed in more detail below, initializer 31 serves to control flip-flop 41 so its outputs change state in a proper phase relationship relative to the outputs of flip-flop 40. Specifically, initializer 31 insures that the B output of flip-flop 40 always leads the F output of flip-flop 41 in phase by less than 180°.

Dual ramp phase detector 33 comprises a conventional ramp generator 60, a conventional ramp generator 61, and a conventional sample and hold circuit 62, which are arranged to function together in a unique manner in accordance with the invention claimed in my referenced application Ser. No. 95,079. Ramp generators 60 and 61 are identical; each has an ENABLE input and a RESET input, ramp generator 60 has an output $R_1$, and ramp generator 61 has an output $R_2$. The ramp generators integrate the potential at their respective inputs until the RESET input is actuated. When a transition from ground to a positive potential occurs at the ENABLE input, a ramp generator produces at its output a potential with a constant slope that increases until a transition from positive to ground potential occurs at the ENABLE input. This potential is then held at the output of the ramp generator until a transition from ground to a positive potential occurs at the RESET input of the ramp generator, at which time the output of the ramp generator returns to ground potential. In other words, ramp generators 60 and 61 serve as time to voltage converters; the potential at the output in the holding interval between each transition from positive to ground potential at the ENABLE input and the following ground to positive transition at the RESET input is proportional to the duration of the previous positive potential pulse applied to the ENABLE input.

The output of AND gate 42 is coupled to the ENABLE input of ramp generator 60 and the output of AND gate 43 is coupled to the RESET input of ramp generator 60. As depicted by the waveforms in FIG. 2, the duration of the positive potential pulses appearing at the output of AND gate 42 is proportional to the time interval between the negative-going, i.e., positive to ground, transitions of the B output of flip-flop 40 and the negative-going transitions of the F output of flip-flop 41. Thus, the output potential of ramp generator 60 during the holding interval is proportional to the phase difference between the states of flip-flops 40 and 41 during every other half cycle of the operation of flip-flop 41. The output of AND gate 45 is coupled to the ENABLE input of ramp generator 61 and the output of AND gate 44 is coupled to the RESET input of ramp generator 61. As depicted by the waveforms in FIGS. 2 and 3 the duration of the positive potential pulses appearing at the output of AND gate 45 is proportional to the time interval between the positive-going, i.e., ground to positive, transitions of the B output of flip-flop 40 and the positive-going transitions of the F output of flip-flop 41. Thus, the output potential of ramp generator 61 during the holding interval is proportional to the phase difference between the states of flip-flops 40 and 41 during every other complementary half cycle of the operation of flip-flop 41. The constants of proportionality of the output potentials of ramp generators 60 and 61 are identical, i.e., for a given phase difference both ramp generators produce the same output potential. As depicted by the waveforms of FIGS. 2 and 3, ramp generator 60 is reset each time a positive-going transition of the F output of flip-flop 41 occurs. This insures that ramp generator 60 is ready to measure the time interval between the next negative-going transitions at the B output of flip-flop 40 and the F output of flip-flop 41, because the B output always leads the F output in phase by less than 180°. As depicted by the waveforms in FIGS. 2 and 3, ramp generator 61 is reset each time a negative-going transition of the F output of flip-flop 41 occurs. This insures that ramp generator 61 is ready to measure the time interval between the next positive-going transitions at the B output of flip-flop 40 and the F output of flip-flop 41, because the B output always leads the F output in phase by less than 180°.

The outputs $R_1$ and $R_2$ of ramp generators 60 and 61 are coupled by identical resistors 63 and 64 to a junction point X that is connected to the input of sample and hole circuit 62. The outputs of AND gates 50 and 51 are coupled to an ENABLE input of sample and hold circuit 62. (Alternatively, source 30 could be directly coupled to the ENABLE input of sample and hold circuit 62.) Thus, at each negative-going transition of the reference pulses coupled through AND gates 50 and 51 from source 30, circuit 62 is reset and the instaneous value of the potential appearing at junction point X is sampled. As depicted by waveform C in FIG. 3, the signal appearing at the output of sample and hold circuit 62 changes at each sampling instant to a value that is proportional to the instantaneous value of the sampled potential and remains constant during the interval between samples at such value. As depicted by waveforms $R_1$, $R_2$, and X in FIG. 3, the potential at junction point X is the sum of the potentials at outputs $R_1$ and $R_2$. As further depicted by these waveforms, at each negative-going transition of the reference pulses from source 30, the output of one of the ramp generators has just reached its peak value at the beginning of the holding interval and the output of the other ramp generator is about to be reset at the end of the holding interval. By sampling the potential at junction point X at this instant in time, as does circuit 62, each sample is proportional to the sum of the phase difference between the states of flip-flops 40 and 41 at two different times, namely during successive half cycles of flip-flop 41.

In summary, the output of sample and hold circuit 62 constitutes the output of phase detector 33 and produces a control signal proportional to the phase difference between the reference pulses from source 30 and the pulses from counter 37. The asymmetry of the reference pulses from source 30, which manifests itself in different values of successive measured time intervals (i.e., different values of the phase difference during successive half cycles of the signal at the F output of flip-flop 41), is averaged out by combining the output signals of ramp generators 60 and 61 at junction point X. As depicted by the transitions of waveform C, the principal ripple component occurs at twice the frequency of operation of flip-flop 41.

The output of sample and hold circuit 62 is coupled to a period or frequency control input of voltage controlled oscillator 36, which is designed to respond to the entire frequency spectrum of the control signal below the frequency of the principal ripple component. Oscillator 36 could be the circuit disclosed in my referenced application Ser. No. 95,077. The signal appearing at the output of circuit 62 continues to change at each sampling instant until the frequency of the pulses appearing at the output of counter 37 is precisely equal to the frequency of the reference pulses from source 30, after which the control signal remains constant at the precise value required to hold the frequency of oscillator 36 in synchronism with a multiple of the frequency of source 30, the multiple being equal to the scaling factor *k* of counter 37. Waveforms *b* and *f* depict the output pulses of counter 37 and reference pulse source 30 respectively, during establishment of frequency synchronization by the system of FIG. 1. Initially, the period of the pulses produced at the output of counter 37 is some arbitrary value $T_I$. Once frequency synchronization is established, the period of the pulses produced at the output of counter 37 equals one-half the average period $T_A$ of the reference pulses from source 30. No fluctuations occur in the control signal produced at the output of sample and hold circuit 62 as the phase difference between individual pulses of waveform *b* and waveform *f* changes due to the asymmetry of waveform *f*. This is attributable to the averaging accomplished by combining the outputs from ramp generators 60 and 61 and by sampling the resultant signal at the instants in time when it is representative of the average of the phase difference on successive half cycles of flip-flop 41.

Coarse parameter selector 35 is coupled to voltage controlled oscillator 36, ramp generator 60, and ramp generator 61. When it is desired to synchronize the system of FIG. 1 to a new source of reference pulses having a frequency in a different range from the reference pulses to which the system was previously synchronized, selector 35 furnishes to voltage controlled oscillator 36 a coarse oscillator period adjustment signal that brings the frequency of oscillator 36 to a nominal frequency close to the multiple *k* of the new frequency of the reference pulses. Similarly, selector 35 provides a ramp slope adjustment signal to ramp generators 60 and 61 to change the slope of the ramps they generate to a value that is appropriate for the new frequency of source 30. Thereafter, the described synchronization system brings voltage controlled oscillator 36 into synchronism with the multiple *k* of the frequency of the new source of reference pulses.

The mode of operation of ramp generators 60 and 61 described above depends upon the existence of a proper phase relationship between the change in states of flip-flops 40 and 41, namely that the B output of flip-flop 40 always leads the F output of flip-flop 41 in phase by less than 180°. This phase relationship is maintained by initializer 31. It should be noted that if the B output were permitted to lead the F output by more than 180°, i.e., the F output would lead the B output by less than 180°, logic control circuit 32 would not control the ENABLE and RESET inputs of ramp generators 60 and 61 in the proper way.

First, the roles of ramp generators 60 and 61 would be reversed, ramp generator 60 measuring the time interval between the positive-going transitions of the B and F outputs and ramp generator 61 measuring the time interval between the negative-going transitions of the B and F outputs. This reversal of roles would bring about a change in direction of the slope of the response characteristic of phase detector 33, which would cause phase detector 33 to adjust oscillator 36 in the wrong direction to bring about frequency synchronization. In other words, the synchronization system would operate in a regenerative mode. Second, the ramp generators would be reset too soon to permit the integrated potentials generated by both ramp generators to appear simultaneously. For example, if the F output leads the B output by less than 180°, ramp generator 61 measures the time interval between each negative-going transition at the B and F outputs and is reset immediately by AND gate 45 when the negative-going transition occurs at the B output.

The output signals of AND gates 42 and 45 serve both to enable ramp generators 60 and 61, respectively, and AND gates 50 and 51, respectively. This inherently prevents flip-flop 41 from operating outside of its proper phase relationship relative to flip-flop 40. In other words, AND gates 50 and 51 control the transmission of reference pulses from source 30 to the C input of flip-flop 41 such that the B output of flip-flop 40 always leads the F output of flip-flop 41 in phase by less than 180°. This inherency can be understood from the following considerations: AND gate 42 does not provide an enabling signal to AND gate 50 unless the B output of flip-flop 40 is at ground potential and the F output of flip-flop 41 is at a positive potential. When these two conditions co-exist, the F output lags the B output in phase by leas than 180°, flip-flop 41 changes state responsive to the next reference pulse from source 30 so its F output assumes ground potential. AND gate 45 does not provide an enabling signal to AND gate 51 unless the F output of flip-flop 41 is at ground potential and the B output of flip-flop 40 is at a positive potential. When these two conditions co-exist, in other words, when the F output lags the B output in phase by less than 180°, flip-flop 41 changes state responsive to the next reference pulse from source 30 so its F output assumes a positive potential.

Thus, AND gates 50 and 51 force flip-flop 41 to maintain the proper phase relationship relative to flip-flop 40. In FIG. 2 the B output and the F output are initially both at ground potential, so the first reference pulse from source 30 shown passes through AND gate 51 after the B output assumes a positive potential. Then, however, due to the large initial discrepancy in period between the $b$ and $f$ waveforms, the proper phase relationship is lost and the second reference pulse from source 30 fails to be coupled to the C input of flip-flop 41. At the point in time when the second reference pulse occurs, which is represented by a dashed line 47 on waveform F, flip-flop 41 does not change state. By the time the third reference pulse occurs, the proper phase relationship is reestablished and flip-flop 41 changes state responsive to this reference pulse. Waveform F′ illustrates the operation of initializer 31 in the case where the F output of flip-flop 41 is initially at a positive potential. In this case, at the time of occurrence of the first two reference pulses, represented respectively by a dashed line 48 and a dashed line 49 on waveform F′, no transition takes place in the state of flip-flop 41. By the time the third reference pulse occurs, the proper phase relationship is established and flip-flop 41 changes state. Initializer 31 operates in the same manner to reestablish the proper phase relationship when a disturbance occurs in the system after synchronization has once been achieved. Basically, when the proper phase relationship is lost, the state of flip-flop 41 is shifted in phase by 180°, in that it fails to change state responsive to the next reference pulse. Thus, AND gates 50 and 51 and flip-flop 41 perform the same function as switch 16 and phase inverter 17 in FIG. 5. It should be noted that while the proper phase relationship is absent, the control signal produced by sample and hold circuit 62 remains constant. Thus, the synchronization system becomes inoperative in the sense that the control signal does not change responsive to changes in the phase difference between the reference pulses of source 30 and the pulses from counter 37.

Figure 4:
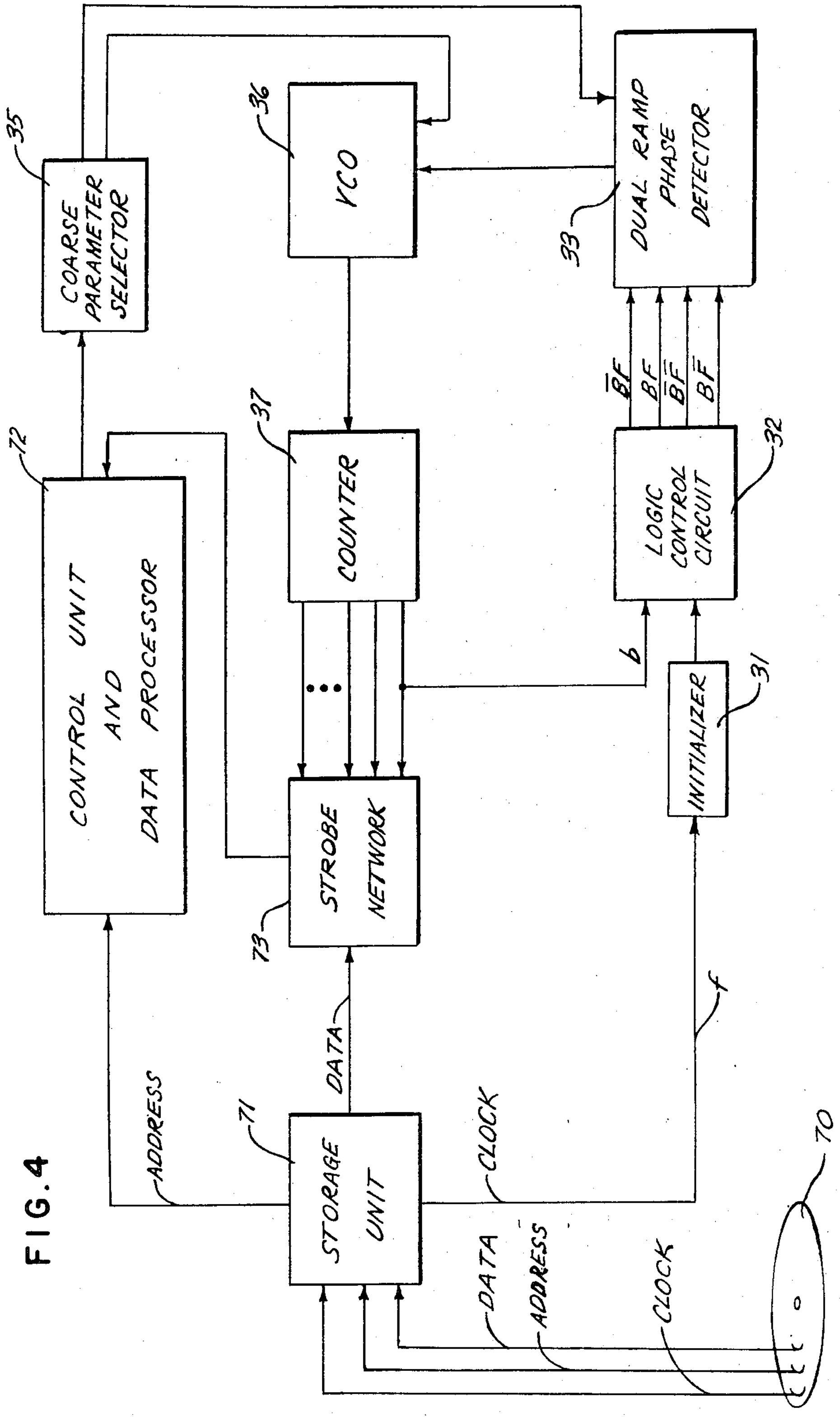
FIG. 4 is a block schematic diagram of a disc file memory system that incorporates the principles of the invention.

In FIG. 4 initializer 31, logic control circuit 32, phase detector 33, coarse parameter selector 35, voltage controlled oscillator 36, and counter 37 are shown as part of an otherwise conventional disk file memory system. A continuously rotating disk 70 with a coating of magnetic material is coupled by magnetic transducer heads (not shown) to a storage unit 71, which contains a plurality of registers for the temporary storage of information taken from the disk until it is utilized. Disk 70 has a number of different concentric zones on which data and clock information are recorded at different densities. Accordingly, the data and clock information read from the different zones are at different frequencies. As depicted in FIG. 3, data address information, and clock information are coupled from disk 70 to storage unit 71. From there, the address information is routed to a control unit and data processor 72, which controls the data storage on and retrieval from the disk file memory system, the data is routed to a strobe network 73, and the clock information in the form of asymmetrical pulses, as illustrated by waveform $f$ of FIG. 2, is routed to initializer 31. The storage and retrieval of data are controlled by control unit and data processor 72. Whenever it is desired to store data on or retrieve data from a particular zone of disk 70, control unit and data processor 72 gives an appropriate command to coarse parameter selector 35 so as to couple an oscillator period adjustment signal to voltage controlled oscillator 36 and ramp slope adjustment signals to phase detector 33. Control unit and data processor 72 also actuates the appropriate magnetic transducer heads to communicate with the selected zone of disk 70. Thereafter, the clock information associated with the selected zone of disk 70 is coupled to initializer 31 as the reference pulses to which one state of counter 37 is synchronized. As depicted in FIG. 4, all $k$, e.g. 10, stages of counter 37 are coupled to strobe network 73 and one of the stages is coupled to logic control circuit 32 to supply thereto pulses as waveform $b$ of FIG. 2. After frequency synchronization is established in the course of data retrieval, strobe network 73 selects one of the states of counter 37 to strobe the data signal received from storage unit 71, depending upon which state of counter 37 corresponds to a reference bit or pulse occurring at the start of each record of data on disk 70.

Regenerated data pulses produced by strobe network 73 responsive to the selected state of counter 37 are coupled to control unit and data processor 72. The make-up of strobe network 73 and the details of the reference bit are described in detail in a co-pending application Ser. No. 660,485 filed Aug. 14, 1967 by L. O. Anderson et al., which matured into U.S. Pat. No. 3,537,075, on Oct. 27, 1970.

The invention can also be employed with a disk file memory system in the course of data storage. In this case, the invention could comprise the synchronizer described in a co-pending application of Peter L. Krause, Ser. No. 80,092 entitled "Information Storage and Retrieval," and filed on Oct. 12, 1970.

The invention has been disclosed in connection with a frequency synchronization system where one train of pulses is brought into precise frequency synchronism with another train of pulses, although the phase relationship between the two trains of frequency synchronized pulses may vary as the conditions in the system vary. For example, different nominal operating frequencies of voltage-controlled oscillator 36 imposed by the oscillator period adjustment signal from selector 35 would normally result in frequency synchronization to the reference pulses with different phase shifts or offsets. Since only frequency synchronization is required, i.e. the phase shift between the frequency synchronized signals is not important, the fact that the reference pulses are shifted in phase by 180° from time to time does not adversely affect the operation of the disk file memory system. However, the invention could also be employed in a phase synchronization system such as that disclosed in application Ser. No. 122,544, filed Mar. 9, 1971, which is a streamlined continuation of application Ser. No. 780,160, where the output of the phase detector would be integrated to form the control signal that adjusts the period of the oscillator to be synchronized. In such case, it might be objectionable to introduce a 180° phase shift into the reference signal so other means would have to be employed to render the synchronization system inoperative while the phase relationship is improper.

The described embodiment of the invention is only considered to be preferred and illustrative of the inventive concept; the scope of the invention is not to be restricted to such an embodiment. Various and numerous arrangements may be devised by one skilled in the art without departing from the spirit and scope of this invention.

What is claimed is:

1. A synchronization system comprising:
- a first source of periodic signals;
- a second source of periodic signals having a period that is adjustable in response to a control signal;
- a phase detector that generates a control signal representative of the phase difference between the periodic signals of the first and second sources, the control signal having a slope in one direction responsive to changes in the phase difference between the periodic signals when the periodic signals have a proper phase relationship and having a slope in the opposite direction responsive to changes in the phase difference between the periodic signals when the periodic signals have an improper phase relationship;
- means responsive to the control signal for adjusting the period of the second source in a sense to bring the periodic signals into synchronization when the periodic signals have the proper phase relationship; and
- means for maintaining the period of the second source constant when the periodic signals have the improper phase relationship.

2. The synchronization system of claim 1, in which the proper phase relationship is one of the periodic signals leading the other by less than 180°, the periodic signals are binary, and the maintaining means comprises means for inverting the signal of one of the sources by 180° whenever the periodic signals have the improper phase relationship.

3. The synchronization system of claim 2, in which the first source produces trigger pulses and the inverting means comprises a flip-flop having a trigger input that changes the state of the flip-flop responsive to applied trigger pulses from the first source and an output coupled to the phase detector, a pulse transmission gate connected between the first source and the trigger input of the flip-flop, and means for enabling the transmission gate only when the output of the flip-flop and the second source have the proper phase relationship.

4. The synchronization system of claim 3, in which the second source has complementary first and second outputs, the flip-flop has complementary first and second outputs, and means are provided for generating an enabling signal for the transmission gate responsive to the coincidence of one of the outputs and the complement of the other output.

5. The synchronization system of claim 4, in which the enabling means comprises an AND gate and the phase detector includes means for producing a control signal proportional to the duration of the enabling signal generated by the AND gate.

6. The synchronization system of claim 5, in which the adjusting means adjusts the period of the second source to bring about frequency synchronization.

7. The synchronization system of claim 2, in which the adjusting means adjusts the period of the second source to bring about frequency synchronization.

8. The combination comprising:
- a first source of periodic signals;
- a second source of periodic signals;
- a phase detector having first and second inputs and an output, the phase detector producing at its output a signal representative of the phase difference between the signals applied to its first and second inputs, the output signal having a slope in one direction for phase differences less than 180° and having a slope in the opposite direction for phase differences greater than 180°;
- means for applying the signal of the first source to the first input of the phase detector;
- means for directly applying the signal of the second source to the second input of the phase detector when the phase difference between the signals of the first and second sources is less than 180°;
- means for applying the signal of the second source to the second input of the phase detector shifted in phase by 180° when the phase difference between the signals of the first and second sources is more than 180°;

utilization means; and means for coupling the output of the phase detector to the utilization means.

9. The combination of claim 8, in which the first source produces a binary square wave output, and the second source produces trigger pulses, the means for directly applying the signal of the second source to the second input of the phase detector comprises a flip-flop having a trigger input, the flip-flop changing state responsive to trigger pulses applied to its trigger input, a transmission gate coupling the second source to the trigger input of the flip-flop, and means for enabling the transmission gate, and the means for applying the signal of the second source to the second input of the phase detector shifted in phase by 180° comprises means for disabling the transmission gate so the flip-flop does not change state responsive to the trigger pulses produced by the second source.

10. The combination of claim 9, in which the first source has complementary first and second outputs, the flip-flop has complementary first and second outputs, and the phase detector comprises an AND gate having first and second inputs, the first output of one and the second output of the other being connected to the inputs of the AND gate, and means for generating a signal proportional in amplitude to the duration of the pulses appearing at the output of the AND gate.

11. The combination of claim 10, in which the means for enabling the transmission gate is a connection from the output of the AND gate to the transmission gate.

12. The combination of claim 9, in which the first source has complementary first and second outputs, the flip-flop has complementary first and second outputs, and the means for enabling the transmission gate is an AND gate having two inputs to which complementary outputs of the flip-flop and the first source are connected.

13. The combination of claim 8, in which the utilization means comprises means for adjusting the period of the first source responsive to the phase detector output signal to synchronize the signals from the first and second sources.

* * * * *